(12) United States Patent
Bortolini et al.

(10) Patent No.: US 6,304,447 B1
(45) Date of Patent: Oct. 16, 2001

(54) ARRANGEMENT FOR COOLING AN ELECTRICAL ASSEMBLY

(75) Inventors: James R. Bortolini, Broomfield; Scott E. Farleigh, Denver, both of CO (US); Gary J. Grimes, Birmingham, AL (US); Jean S. Nyquist, Denver; Charles J. Sherman, Westminster, both of CO (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/476,024

(22) Filed: Dec. 31, 1999

Related U.S. Application Data

(63) Continuation-in-part of application No. 09/224,589, filed on Dec. 31, 1998, now Pat. No. 6,208,511.

(51) Int. Cl.[7] .................................................. H05K 7/20
(52) U.S. Cl. ................. 361/699; 29/890.03; 165/104.33; 257/714; 361/719
(58) Field of Search ............................ 29/827, 830–832, 29/840, 841, 890.03; 62/259.2, 418, 419; 165/80.3, 80.4, 104.33, 104.34; 257/712–714; 361/717–719, 698, 699, 703

(56) References Cited

U.S. PATENT DOCUMENTS

| | | |
|---|---|---|
| 4,891,688 * | 1/1990 | Longerich ........................ 361/737 |
| 5,390,077 | 2/1995 | Paterson . |
| 5,706,668 * | 1/1998 | Hilpert ............................. 62/259.2 |
| 5,847,927 * | 12/1998 | Minning et al. ................... 361/696 |
| 6,052,284 * | 4/2000 | Suga et al. ........................ 361/699 |

FOREIGN PATENT DOCUMENTS

1018623A * 1/1966 (GB) .

* cited by examiner

*Primary Examiner*—Gerald Tolin
(74) *Attorney, Agent, or Firm*—Maginot, Addison & Moore

(57) ABSTRACT

An arrangement for cooling an electronic assembly includes a circuit board and an enclosure member. The circuit board has a first surface, a second surface, and at least a first electronic component or other heat-generating element secured to the first surface. The enclosure member is secured to said circuit board so as to form a fluid tight barrier of a compartment defined at least in part by said enclosure member. Such compartment includes a first subcompartment defined at least in part by said first surface and said enclosure member and a second subcompartment defined at least in part by said second surface and said enclosure member. The circuit board further includes at least one aperture extending between the first surface and the second surface such that the first subcompartment is in fluid communication with the second subcompartment.

23 Claims, 8 Drawing Sheets

ARRANGEMENT FOR COOLING AN ELECTRICAL ASSEMBLY

CROSS REFERENCE TO RELATED APPLICATION

This application is a continuation-in-part of U.S. patent application Ser. No. 09/224,589, filed Dec. 31, 1998, now U.S. Pat. No. 6,208,511, which is incorporated herein by reference.

FIELD OF THE INVENTION

The present invention relates generally to arrangements for cooling electronic assemblies, and more particularly, to arrangements for liquid-cooling such assemblies.

BACKGROUND OF THE INVENTION

Electronic assemblies which include a circuit board having a plurality of electronic components attached thereto are widely used in the communications industry to manage the flow of data on a telecommunications network. These electronic assemblies must be able to manage a high data rate over significant periods of time (e.g., months) without any maintenance. One problem encountered with these electronic assemblies, as well as other types of electronic assemblies, is that their high speed operations generate a significant amount of heat which can be detrimental to the electronic assemblies and thus cause maintenance problems. As a result, these electronic assemblies must be cooled constantly in order to maintain acceptable operating temperatures to avoid maintenance problems.

Several different approaches have been utilized in an attempt to address the aforementioned cooling requirement. For example, one approach employs assisted cooling techniques to maintain the electronic assembly within acceptable temperature limits. These assisted cooling techniques typically involve externally-powered cooling devices, such as fans. In a telecommunication central office switch, large fans are employed to provide the necessary cooling to the electronic assemblies. However, the use of assisted cooling techniques are discouraged by the communications industry because assisted cooling techniques can introduce a hazard to technicians working in the area. For example, the use of large fans can undesirably create a hazardous noise level. In addition, the types of fans used in assisted cooling tend to break down and thus increase the maintenance problems associated with servicing the telecommunications network.

Another approach utilizes a liquid to cool the electronic components attached to the circuit board. While liquid cooling improves the rate at which heat is dissipated from the various electronic devices, there is a need to improve the heat dissipation rates currently achievable without adding significant bulk to the overall assembly.

SUMMARY OF THE INVENTION

The present invention fulfills the above needs, as well as others, by providing an arrangement for cooling an electrical assembly that includes a circuit board at least partly disposed in a fluid tight compartment formed by an enclosure. The circuit board divides the compartment into first and second subcompartments. The circuit board includes at least one aperture through which liquid may flow from one subcompartment to another. The aperture allows liquid that has been heated from one or more electrical components in one subcompartment to flow to another compartment Such flow of the heated liquid increases the liquid's ability to dissipate the heat.

In one embodiment of the present invention, an arrangement for cooling an electronic assembly includes a circuit board and an enclosure member. The circuit board has a first surface, a second surface, and at least a first electronic component (or other heat-generating element) secured to the first surface. The enclosure member is secured to said circuit board so as to form a fluid tight barrier of a compartment defined at least in part by said enclosure member. Such compartment includes a first subcompartment defined at least in part by said first surface and said enclosure member and a second subcompartment defined at least in part by said second surface and said enclosure member. The circuit board further includes at least one aperture extending between the first surface and the second surface such that the first subcompartment is in fluid communication with the second subcompartment.

The aperture as used in the above arrangement allows for fluid flow between the first subcompartment and the second subcompartment. Thus, for example, if the first subcompartment includes more heat-generating components, such as the first electronic component, then the heat generated within the first subcompartment may be conveyed to the cooler second subcompartment via the liquid flow through the aperture.

The above described features and advantages, as well as others, will become more readily apparent to those of ordinary skill in the art by reference to the following detailed description and accompanying drawings.

DETAILED DESCRIPTION

Figure 1:
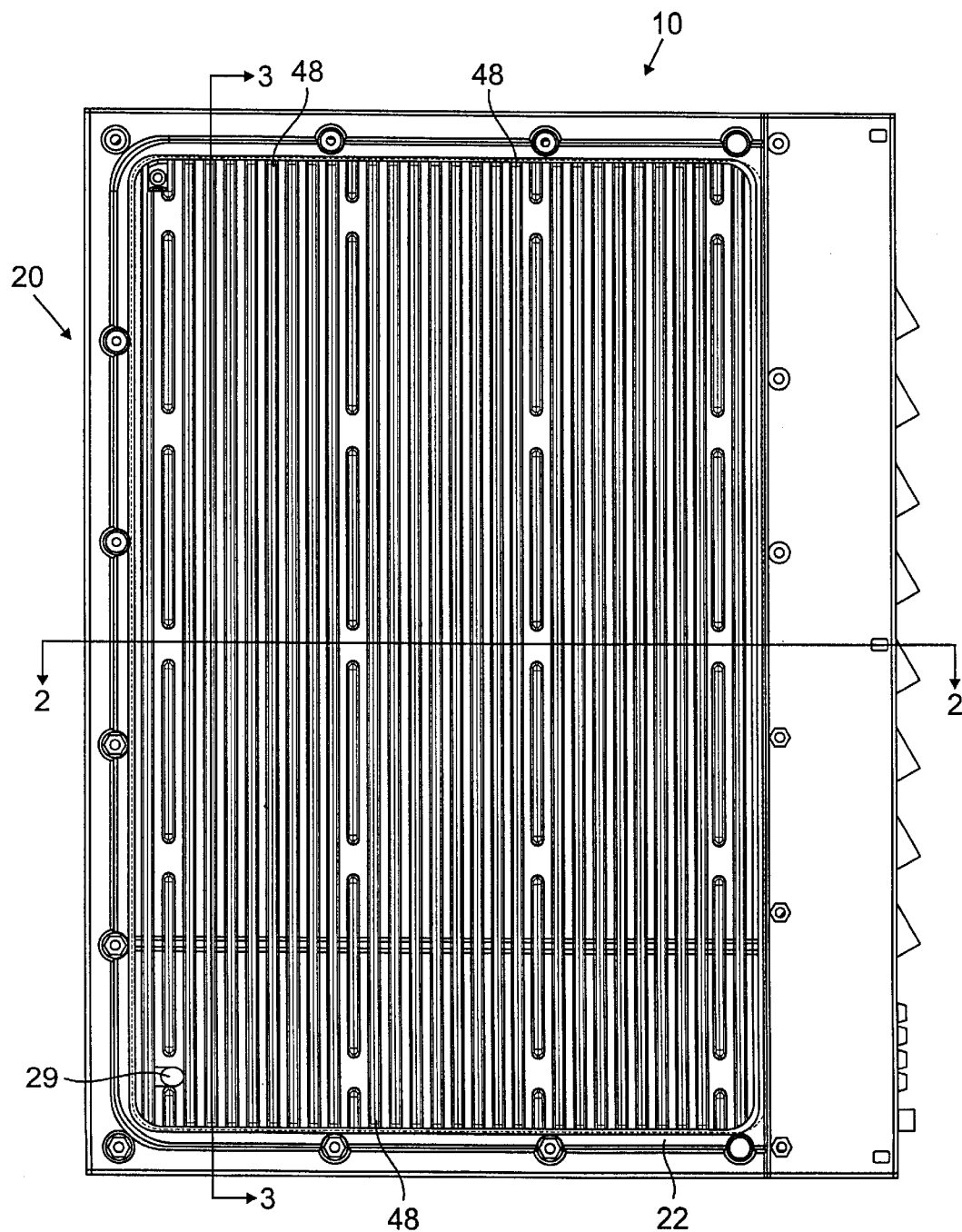
FIG. 1 shows a side elevational view of an arrangement for cooling an electronic assembly which incorporates the features of the present invention therein.

Referring to FIGS. 1, 2, 3, 4, 5 and 6, there is shown an arrangement 10 for cooling an electronic assembly 12 which incorporates the features of the present invention therein. The arrangement 10 includes an enclosure member 20 and a circuit board 14. In accordance with the present invention, the circuit board 14 includes at least one aperture, shown by way of example as the upper apertures 70, for facilitating liquid flow from a first subcompartment 52 to a second subcompartment 54 to assist in cooling of electrical components on the circuit board 14 (see generally FIG. 6).

In general, the plurality of electronic components includes switching devices, power management devices, filter devices, memory devices, and processor devices. However, hereinafter, only a first electronic component 30 and a second electronic component 34 will be discussed in detail for clarity of description. In the exemplary embodiment described herein, the arrangement 10 further includes a fluid 32, a gas 36, a first sealing member 38, a second sealing member 40, a first wall segment 42, a second wall segment 44, and a plurality of fins 48.

The enclosure member 20 includes a first plate member 22, a second plate member 24, a plurality of fins 48, first and second wall segments 42 and 44, and at least one sealing member channel 68. The plurality of fins 48 extend perpendicularly from each of the first and second plate members 22 and 24. The first wall segment 42 extends from one edge of the plate member 22 and the second wall segment 44 extends from the second plate member 24. The sealing member channel 68 is disposed at the periphery of the first plate member 22, and is in part disposed between the first plate member 22 and the first wall segment 42. In a substantially identical manner, a sealing member channel (not shown) is also disposed at the periphery of the second plate member 24.

It is noted that the embodiment described has an additional advantage of including a portion of the circuit board 14 that is not liquid cooled, which may be used to house elements that are not amenable to liquid cooling.

In particular, the circuit board 14 in the exemplary embodiment described herein includes a primary circuit board portion 16 and a secondary circuit board portion 18 integrally secured to the primary circuit board portion 16. The circuit board 14 also has a first surface 58 and a second surface 60 defined thereon. The primary circuit board portion 16 includes at its periphery a sealing member location 64 defined on first surface 58. The primary circuit board portion 16 also has a sealing member location (not shown) defined on the second surface 60 which is substantially identical to the sealing member location 64. As shown more clearly in FIG. 4, a segment 66 of the sealing member location 64 is interposed between the primary circuit board portion 16 and the secondary circuit board portion 18. In a similar manner, a segment (not shown) of the sealing member location (not shown) defined on the second surface 60 is interposed between the primary circuit board portion 16 and the secondary circuit board portion 18.

The first electronic component 30 is an electronic device that generates heat during operation and may be liquid cooled. The second electronic component 34 is a device that is not amenable to liquid cooling, such as, for example, an optical transmitter. The first electronic component 30 is secured to the primary circuit board portion 16 such that the first electronic component 30 is located on the first surface 58 of the circuit board 14. For reasons that will be discussed in further detail below, it is preferable to place all of the circuit components in the primary circuit board portion 16 on one side of the circuit board 14, or in other words on the first surface 58. In any event, the second electronic component 34 is similarly secured to the secondary circuit board portion 18 such that the second electronic component 34 is also located on the first surface 58 of the circuit board 14.

Figure 2:
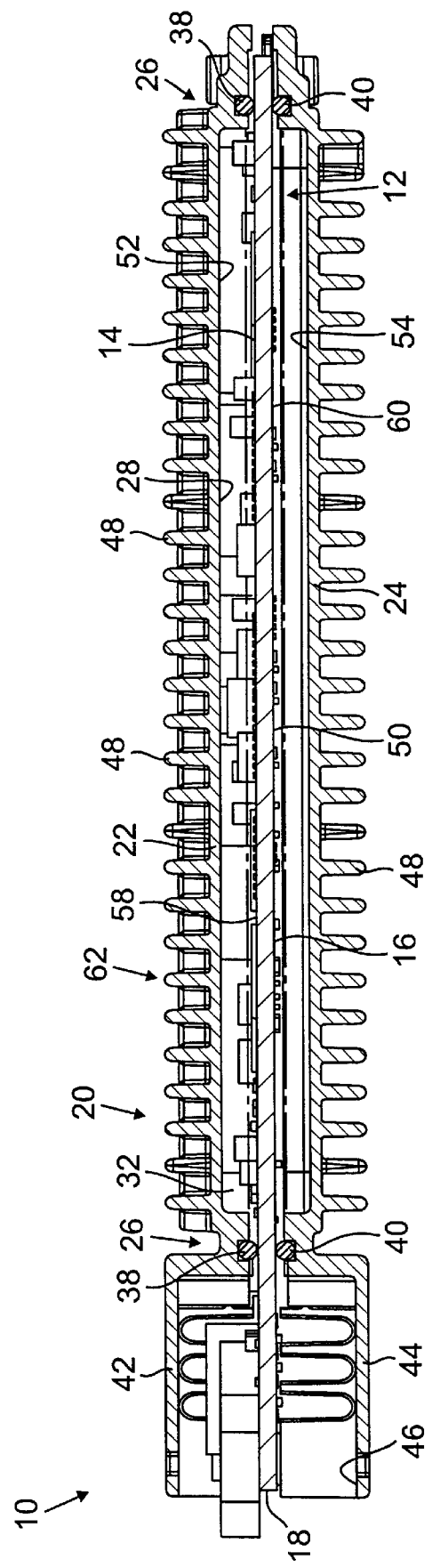
FIG. 2 is a cross sectional view of the arrangement of FIG. 1 taken along the line 2—2 as viewed in the direction of the arrows.
Figure 4:
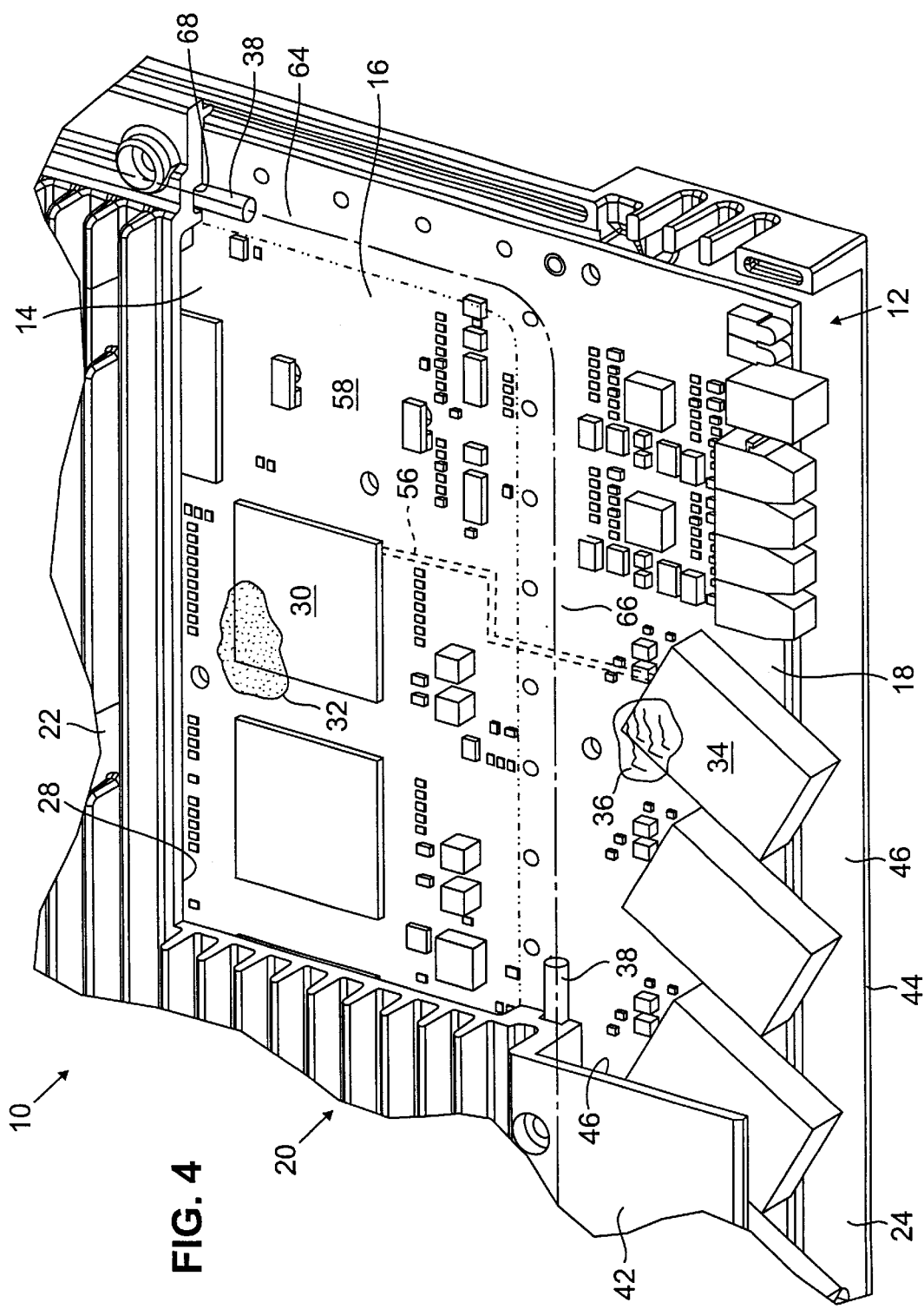
FIG. 4 is an enlarged view of a portion of FIG. 3.

As shown more clearly in FIGS. 2 and 4, the first sealing member 38 is positioned on the sealing member location 64 of the primary circuit board portion 16. The first plate member 22 is then positioned relative to the circuit board 14 such that the first sealing member 38 is (i) positioned within the sealing member channel 68 and (ii) interposed between the primary circuit board portion 16 and the first plate member 22. The first sealing member 38 may suitably be a rubber gasket having, for example, a circular cross section when uncompressed. The first sealing member 38 should be chemically resistant to the liquid coolant that is employed within the arrangement 10 as discussed further below.

The second sealing member 40 is substantially identical to the first sealing member 38. The second sealing member 40 is positioned on the sealing member location (not shown) defined on the second surface 60 in a similar manner as that described above for the first sealing member 38. The second plate member 24 is then positioned relative to the circuit board 14 such that the second sealing member 40 is (i) positioned within the sealing member channel defined in the second plate member 24 and (ii) interposed between the primary circuit board portion 16 and the second plate member 24.

Once the first plate member 22, the first sealing member 38, the circuit board 14, the second sealing member 40, and the second plate member 24 are positioned in the above described manner, the first plate member 22 and the second plate member 24 are secured together and to the circuit board 14 via a number of fasteners (e.g., screws) inserted through holes defined in the first plate member 22, the second plate member 24, and the circuit board 14.

It should be understood that positioning and securing the first plate member 22, the first sealing member 38, the circuit board 14, the second sealing member 40, and the second plate member 24 in the above described manner results in the enclosure member 20 and the primary circuit board portion 16 cooperating so as to create a fluid tight barrier 26 of a compartment 28. In particular, the first plate member 22, the first sealing member 38, the primary circuit board portion 16, the second sealing member 40, and the second plate member 24 cooperate so as to create the fluid tight barrier 26 of the compartment 28.

Figure 5:
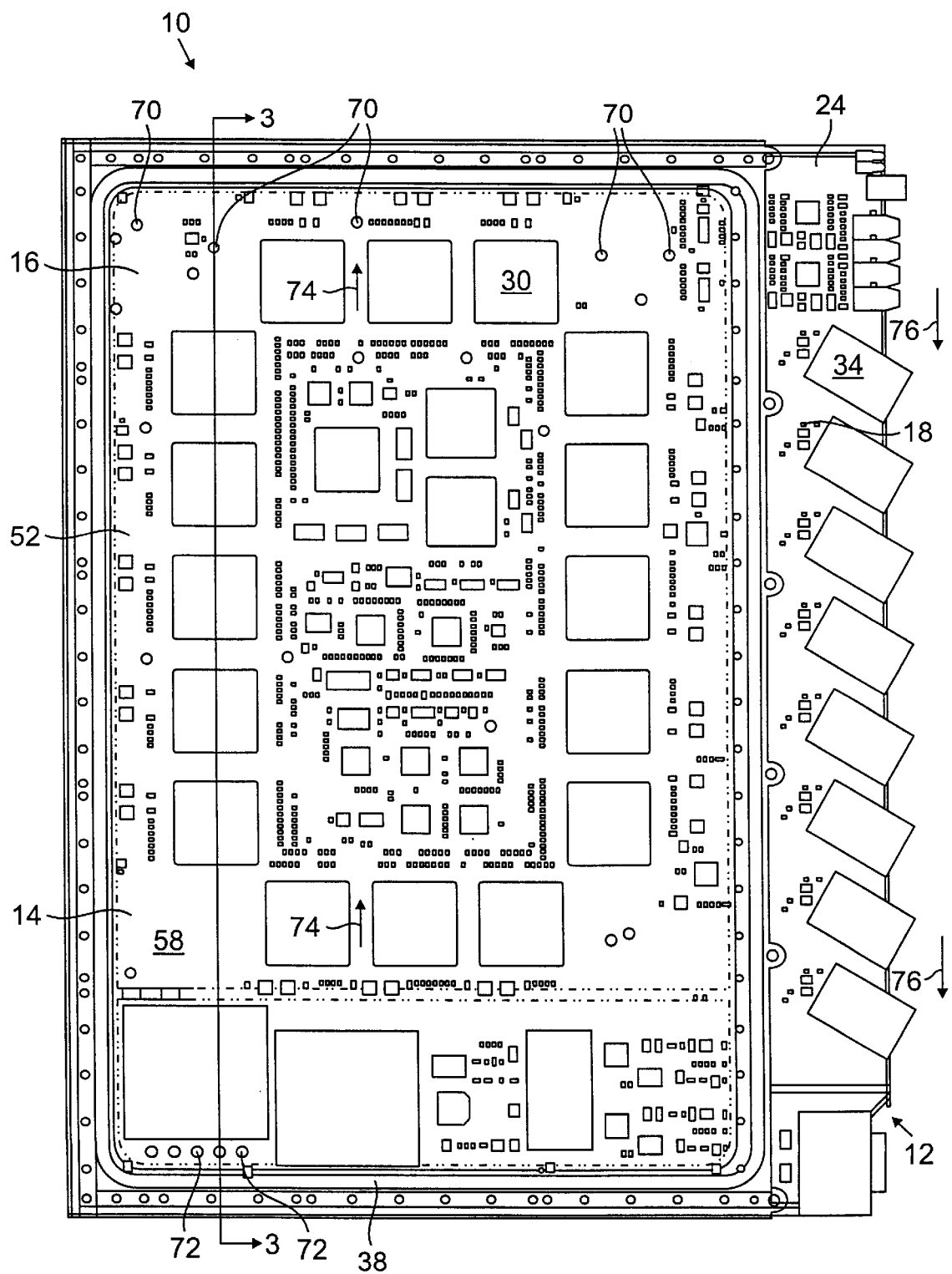
FIG. 5 is a view similar to the one shown in FIG. 1, but showing the first enclosure member removed for clarity of description.

It should be appreciated that the above described arrangement of the aforementioned components locates the primary circuit board portion 16 within the compartment 28 such that the primary circuit board portion 16 defines a partition 50 which divides compartment 28 into a first subcompartment 52 and a second subcompartment 54 as shown in FIG. 2. Moreover, as shown in FIG. 5, the primary circuit board portion 16 has a number of upper apertures 70 defined therein and a number of lower apertures 72 defined therein. The upper apertures 70 and the lower apertures 72 allow fluid communication between the first subcompartment 52 and the second subcompartment 54 of the compartment 28. The upper apertures 70 are located above the lower apertures 72 and are preferably located proximate the upper end of the circuit board 14. By "proximate the upper end", it is meant that the upper apertures are located closer to the upper end than the lower end. Likewise, it is preferable that the lower apertures 72 are located proximate the lower end of the circuit board 14.

It should also be appreciated that, since the first electronic component 30 is secured to the primary circuit board portion, the first electronic component 30 is also located within the compartment 28. In particular, the first electronic component 30 is located within the first subcompartment 52 of the compartment 28. It should further be appreciated that the above described arrangement locates the secondary circuit board portion 18 outside of the compartment 28. Furthermore, since the second electronic component 34 is secured to the secondary circuit board portion 18, the second electronic component 34 is located outside of the compartment 28.

However, it should be understood that, as shown in FIG. 4, the first electronic component 30 is electrically coupled to the second electronic component 34 via at least one conductive trace 56. A segment of the trace 56 is interposed between the first surface 58 and the second surface 60 of the circuit board 14 while each end of trace 56 extends through first surface 58 so as to be electrically interfaced either directly or indirectly with the first electronic component 30 and the second electronic component 34. It should be appreciated that, while only first electronic component 30 and second electronic component 34 are shown electrically coupled via a trace interposed between the first surface 58 and the second surface 60 of the circuit board 14, several of the electronic components located within the compartment 28 may be electrically coupled to electronic components located outside of the compartment 28 (i.e. on secondary circuit board portion 18) utilizing similar traces interposed between the first surface 58 and the second surface 60 of the circuit board 14.

Figure 3:
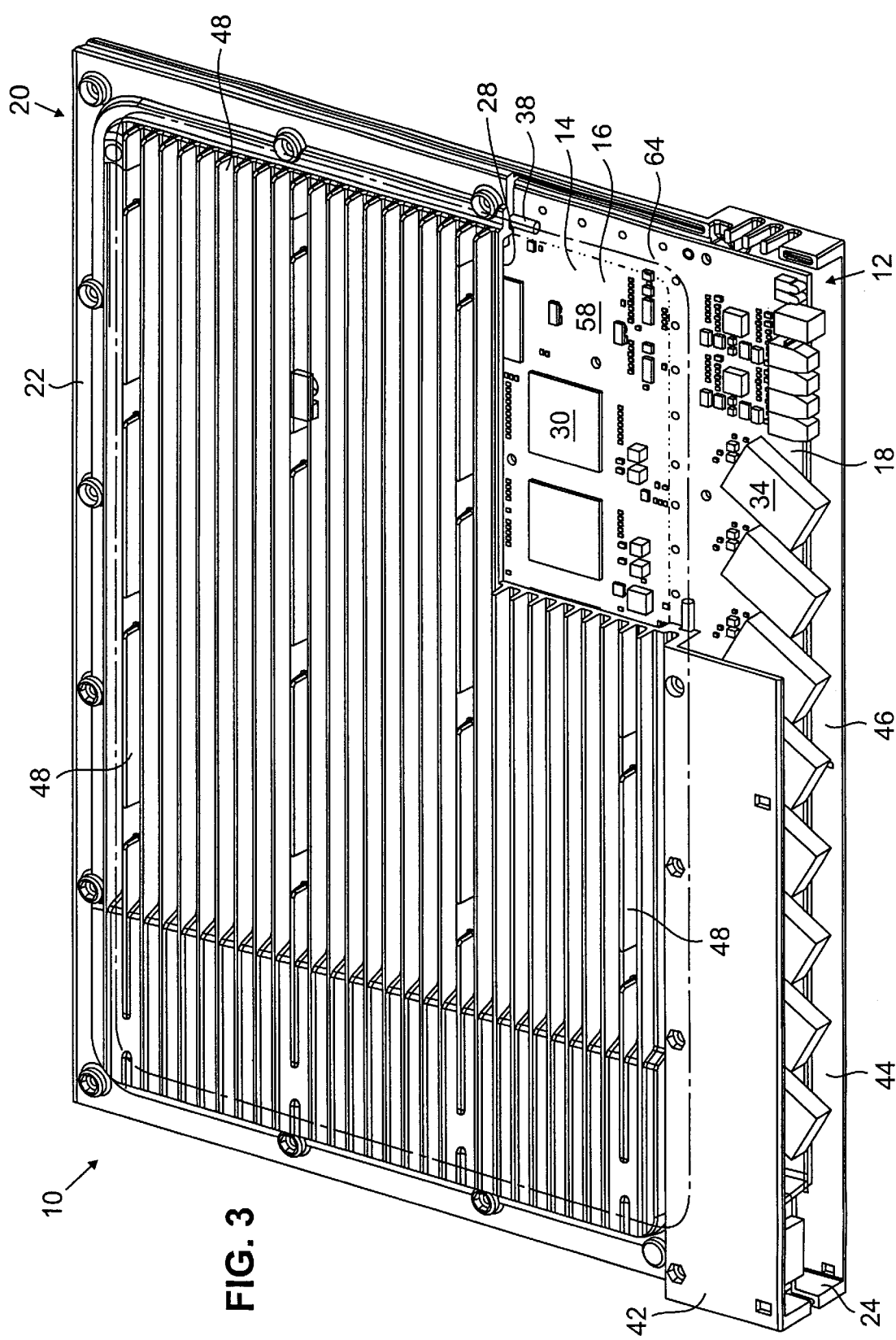
FIG. 3 is a perspective fragmentary view of the arrangement of FIG. 1.

Attaching the first plate member 22 and the second plate member 24 to each other as previously described results in the first wall segment 42 and the second wall segment 44 cooperating so as to define a cavity 46 as clearly shown in FIGS. 2, 3, and 4. The secondary circuit board portion 18 is positioned within cavity 46. Moreover, since the second electronic component 34 is attached to the secondary circuit board portion 18, the second electronic component 34 is also positioned within the cavity 46.

As shown in FIGS. 2 and 4, a liquid 32 is disposed within the compartment 28 via a port (not shown) defined in the first plate member 22. Preferably, the liquid 32 is disposed within the compartment 28 such that the liquid 32 is in direct contact with all of the electronic components secured to the primary circuit board portion 16. To this end, the enclosure member 20 includes a rotatably insertable fluid stop 29 that fits into an aperture in the first plate member 22. After the first plate member 22 and the second plate member 24 are secured to each other as described above, the liquid 32 is disposed into the compartment 28 through the aperture. The fluid stop 29 is then secured into the aperture to enclose the liquid 32 in the compartment 28.

As shown in FIG. 4, the liquid 32 is in direct contact with the first electronic component 30. It should be understood that the liquid 32 can pass through upper apertures 70 and lower apertures 72 such that both the first subcompartment 52 and a second subcompartment 54 of the compartment 28 are nearly full of liquid 32. Preferably, the liquid 32 is a cooling fluorocarbon liquid, such as the commercially available product Fluorinert FC-77, which is available from Minnesota Mining & Manufacturing, Inc.

As depicted in FIG. 4, the cavity 46 allows a gas 36, such as air, to come into direct contact with the electronic components (e.g. second electronic component 34) attached to the secondary circuit board portion 18.

It should be understood that the compartment 28 is fluid tight. Therefore, the compartment 28 prevents the liquid 32 from entering the cavity 46 and coming into contact with any of the electronic components attached to the secondary circuit board portion 18 (e.g. the second electronic component 34). In particular, the fluid tight barrier 26 prevents the liquid 32 from contacting any of the electronic components attached to the secondary circuit board portion 18. Therefore, it should be appreciated that the electronic components attached to the circuit board 14 are segregated into two separate environments. Specifically, the electronic components secured to the primary circuit board portion 16 (e.g. first electronic component 30) of the circuit board 14 are bathed in a liquid environment provided by the liquid 32. On the other hand, the electronic components secured to the secondary circuit board portion 18 (e.g. second electronic component 34) are located in a gaseous environment, i.e., the air.

During use of the arrangement 10, the electronic components attached to the circuit board 14 generate a significant amount of heat. However, this heat is effectively managed by the advantageous design features of the present invention. In general, the liquid 32 transfers heat from the electronic components towards the enclosure member 20. The enclosure member 20, which is preferably constructed of a heat conducting material such as aluminum, conducts heat to the fins 48 thereon. The fins 48 provide a substantial amount of surface area for the heat to dissipate.

In addition, in accordance with the present invention, a least some portions of the liquid 32 circulate through the compartment 28, thereby enhancing the heat exchange between the electronic components attached to primary circuit board portion 16 and the enclosure member 20. In particular, because most, if not all, of the electronic components are secured to the primary circuit board portion 16 on the first surface 58 of the circuit board 14, most of the heat generating elements are positioned within the first subcompartment 52. Because most of the heat generating elements are positioned within the first subcompartment, the temperature of the liquid 32 located in the first subcompartment 52 will typically be higher than the liquid 32 located in the second subcompartment 54.

As a result, a temperature gradient is established between the liquid 32 located in the first subcompartment 52 and the liquid 32 located in the second subcompartment 54. To increase the ability to dissipate heat from the electronic elements on the circuit board 14, the circuit board 14 includes at least one aperture, and preferably, a set of upper apertures 70 and a set of lower apertures 72. In general, such apertures provide a point of egress for the relatively warm liquid to escape the first subcompartment 52 and thus dissipate the heat from the electronic components further away from the circuit board.

In a preferred embodiment, the arrangement 10 of the present invention is configured to allow circulation of the liquid between the first subcompartment 52 and the second subcompartment 54. To this end, the upper apertures 70 allow movement of liquid from the first subcompartment 52 to the second subcompartment 54 and the lower apertures allow movement of liquid from the second subcompartment 54 to the first subcompartment 52.

Figure 6:
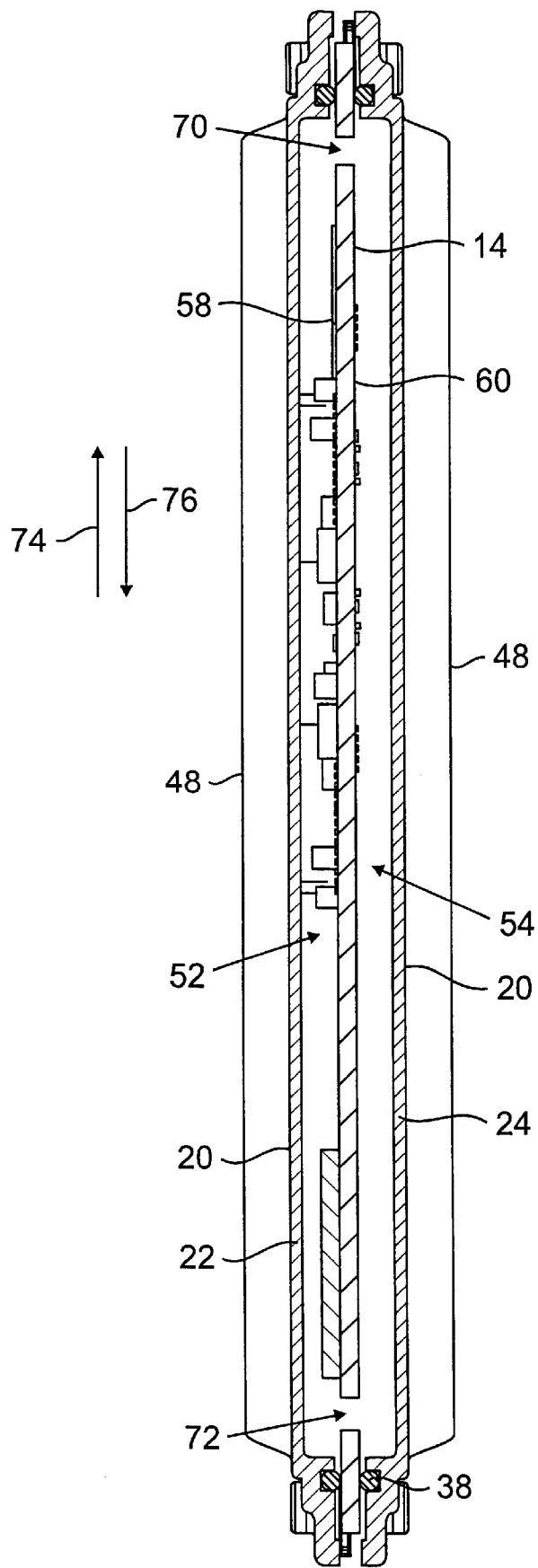
FIG. 6 is a cross sectional view of the arrangement of FIG. 1 taken along section 3—3

During use, the electronic assembly 12 is vertically oriented as shown in FIGS. 5 and 6. As discussed above, the electronic components (such as the electronic component 30) in the first subcompartment 52 generate a substantial majority of the heat energy generated by the electronic circuit 12. As a result, at least a portion of the liquid 32 that is located in the first subcompartment 52 absorbs a large amount of heat energy from the circuit 12 because that liquid has a large amount of surface area contact with the various heat-generating electronic components. As a consequence, this portion of the liquid 32 will be at a higher temperature than then portion of the liquid 32 in the second subcompartment 54.

Because the tendency of relatively warm liquid is to rise, the relatively warm liquid 32 located in the first subcompartment 52 will rise in the direction indicated by arrows 74 (see FIGS. 5 and 6). As more of the liquid 32 rises, some of the liquid 32 advances through the upper apertures 70 and into the second subcompartment 54.

Consequently, because the tendency of relatively cool liquid is to sink, the relatively cool portion of liquid 32 located in the second subcompartment 54 will sink in the direction indicated by arrows 76 (see FIGS. 5 and 6). The downward movement of the relatively cool portion of liquid 32 is assisted by the influx of relatively warm liquid 32 at the upper apertures 70. As the relatively cool liquid 32 located in the second subcompartment 54 sinks in the above described manner, the liquid 32 is advanced through the lower apertures 72 and thus enters the first subcompartment 52.

Once located in the second subcompartment 54, the relatively warm portion of the liquid 32 begins to cool because little or no heat generating electronic components are located within second subcompartment 54 and the heat may be dissipated through the fins 48 of the second plate member 24. Similarly, once located in first subcompartment 52, the relatively cool liquid 32 begins to warm and thus rise as it comes into contact with the heat generating electronic components located within the first subcompartment 52.

The above-described convection action causes continuous circulation of the liquid 32 between the first subcompartment 52 and the second subcompartment 54. This continuous circulation of the liquid 32 significantly enhances the heat exchange relationship between the electronic components located within the compartment 28 and the liquid 32. In particular, the circulation of the liquid increases the rate of heat transfer to more surface areas, including the more fins 48, of the enclosure member 20.

The electronic components located in a gaseous environment, i.e. those electronic components attached to secondary circuit board portion 18, are in a heat exchange relationship with gas 36, e.g. air. These components are effectively cooled by air convection cooling.

The above described combination of cooling some of the electronic components attached to the circuit board 14 with liquid 32 (e.g., the first electronic component 30) while cooling other electronic components attached to the circuit board 14 with gas 36 (e.g., the second electronic component 34) may effectively maintain the temperature of the electronic assembly 12 within acceptable limits without any assisted cooling (i.e. fans). For example, the arrangement 10 of the present invention can effectively cool a 100 watt circuit board without the use of assisted cooling (i.e., without the use of fans). The present invention achieves such heat dissipation through the use of liquid cooling, further enhanced by the continuous circulation of the liquid within the compartment 28.

It will be noted that the heat dissipation provided by the present invention is plainly applicable to dissipating heat from any heat-generating elements on the circuit board, and not just electronic components.

The arrangement 10 of the present invention also allows electronic components which have different abilities to tolerate heat to be attached to the same circuit board. Consider a situation in which the first electronic component 30 is an integrated circuit and the second electronic component 34 is an optoelectronic device. The integrated circuit device is typically capable of tolerating a greater amount of heat than the optoelectronic device. The arrangement 10 of the present invention allows both of these electronic components to be secured to a single circuit board, i.e. circuit board 14, while substantially isolating the optoelectronic device from the relatively hot environment in which the integrated circuit devices operate. This isolation is achieved by locating heat tolerant electronic components (e.g., the first electronic component 30) within the compartment 28, while locating electronic components which are relatively heat sensitive (e.g., the second electronic component 34) outside of the compartment 28, away from the heat tolerant electronic components. The ability to locate both heat tolerant and heat sensitive electronic components on a single circuit board is advantageous because the resulting circuit benefits from better electrical connections inherent in single board construction.

The present invention thus provides significant advantages over designs that do not allow gas cooled and liquid cooled electronic components on the same circuit board. These types of designs typically include at least one or more circuit boards having electronic components thereon being cooled in a gaseous environment, and other circuit boards having electronic components thereon being cooled in a liquid environment. Specifically, the circuit boards cooled in a liquid environment are typically completely housed in a box filled with a cooling liquid. These designs electrically interconnect the gas cooled electronic components to the liquid cooled electronic components utilizing special insulated feedthroughs which must extend through a wall of the box so as to interface with the liquid cooled electronic components contained therein. These feedthroughs always introduce a large impedance discontinuity in the signal path, thereby limiting the bandwidth that can be transmitted. In addition, these designs suffer from the problem of leakage of the cooling liquid at the point where the feedthrough penetrates the box wall. The present invention avoids the aforementioned problems by disposing the liquid cooled electronic components and the gas cooled electronic components on a single circuit board (i.e., circuit board 14) and coupling the liquid and gas cooled electronic components via traces interposed between first surface 58 and second surface 60 of circuit board 14.

It will be appreciated that the advantages of the present invention provided by the inclusion of apertures, for example, may be obtained in alternative embodiments that do not include a portion of the circuit board 14 that extend outside the compartment 28. In other words, many of the heat dissipation advantages of the present invention may be obtained without employing both gas-cooled and liquid-cooled elements on the same circuit board. Moreover, such advantages may be obtained in embodiments that do not employ the circuit board 14 as part of the overall fluid tight barrier.

Similarly, the exact configuration of the upper and lower apertures 70, 72 is not critical to obtain the benefits of circulation of the liquid 32 provided thereby. At least some additional advantages, however, are provided by location the upper apertures 70 proximate to the top end of the electronic assembly 12. In particular, the tendency of the heated portion of the liquid 32 to rise advances the heated portion of the liquid toward such upper apertures 70. However, even such additional advantages may be obtained through any suitable number of apertures 70 located in any position proximate to the upper end of the electronic assembly.

Figure 7:
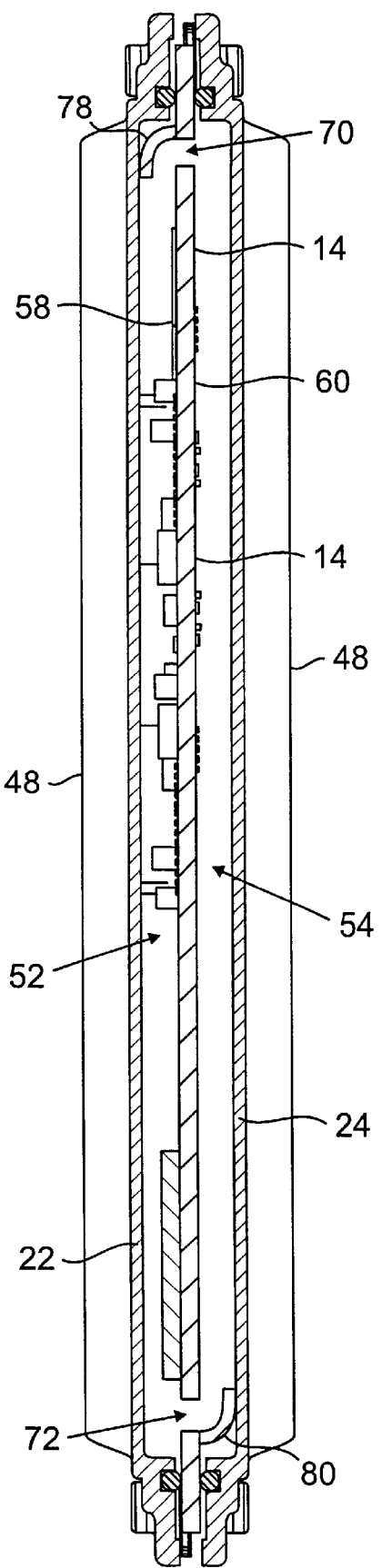
FIG. 7 is a cross sectional view of an alternative arrangement according to the present invention.
Figure 8:
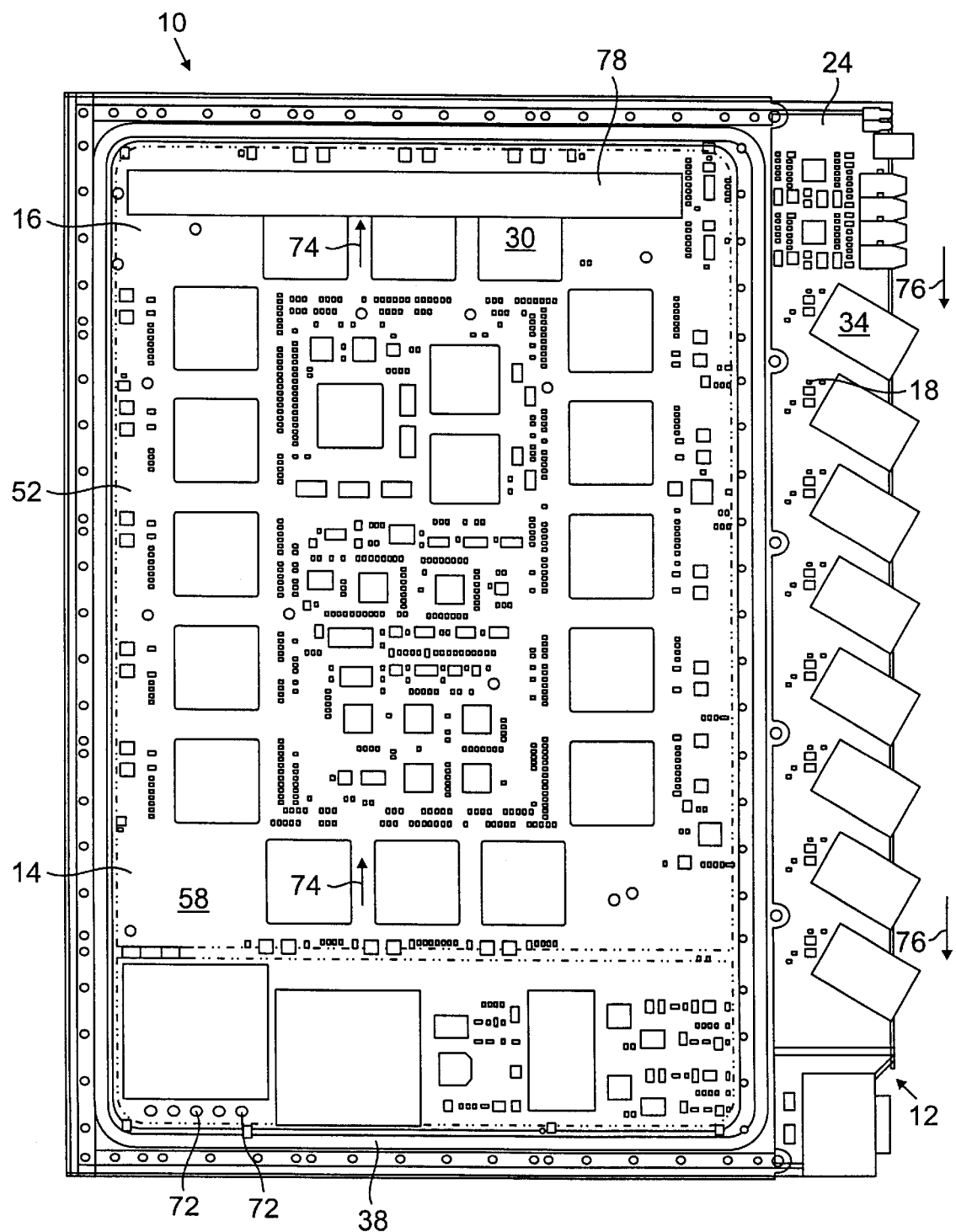
FIG. 8 is a side elevational view of the alternative arrangement of FIG. 7 showing the first enclosure member removed for clarity of description.

FIGS. 7 and 8 show an alternative embodiment of the present invention based largely on the embodiment described above in connection with FIGS. 1 through 6. Indeed, the alternative embodiment of FIGS. 7 and 8 constitutes the same arrangement 10 of FIGS. 1 through 6 with two additional components. The additional components are first and second baffles 78 and 80, respectively.

The first baffle 78 is a structure that is disposed within the first subcompartment 52 and which is configured to assist in directing liquid flow toward the upper apertures 70. To this end, the first baffle 78 preferably has a shape that extends outward from the circuit board 14 at a position above one or more of the upper apertures 70 and then extends downward, thereby forming a curved or arched wall that directs upward flowing liquid toward the upper apertures 70.

Preferably, the first baffle 78 has a length that extends substantially the width of the enclosure member 20, as shown in FIG. 8. Such a length is preferably because it reduces the amount of liquid flow to dead zones that are located above the first baffle 78. Reducing the amount of liquid that can access such dead zones increases the overall ability of the arrangement to circulate the relatively high temperature liquid to the cooler second subcompartment 54 as discussed above. However, in the alternative, the first baffle 78 may have a length sufficient to only cover one or a few of the upper apertures 70. Alternatively, several smaller baffles may be used, for example, one for each of the upper apertures 70.

The first baffle 78 may suitably be constructed of any rigid material that has similar heat properties as the other structural components of the arrangement 10. The first baffle 78 may constitute a structure that is affixed to the circuit board 14, or a structure that is affixed to the enclosure member 20. Indeed, the first and second baffles 78 and 80 may be integrally formed with the enclosure member 20.

The second baffle 80 is preferably located in the second subcompartment 80 proximate the lower apertures 72. The second baffle 80 preferably extends outward from the circuit board 14 at a position that is below one or more of the lower apertures 72 and then arches or curves upward. Otherwise, the second baffle 80 may be configured and arranged in any of the manners discussed above in connection with the first baffle 78.

The baffles 78 and 80 thus assist in the circulation of the liquid 32 between the first subcompartment 52 and the second subcompartment 54 by directing liquid toward the corresponding apertures 70 and 72. As discussed above, without the baffles 78 and 80 dead zones of liquid circulation would form above the upper apertures 70 and below the lower apertures 72. Such dead zones decrease the efficiency of the heat dissipation provided by the liquid circulation. The baffles 78 and 80 inhibit liquid flow into the dead zones and thus diffuse the negative impact of the dead zones on heat dissipation.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected. For example, the enclosure member 20 of the present invention need not comprise two opposing plate members as described above, but instead may be a single piece enclosure that cooperates with the circuit board 14 to form a fluid tight container.

We claim:

1. An arrangement for cooling an electronic assembly, the arrangement comprising:

a circuit board having a first surface, a second surface, and at least a first heat-generating element secured to the first surface;

an enclosure member secured to said circuit board so as to form a fluid tight compartment defined at least in part by said enclosure member, said compartment including a first subcompartment defined at least in part by said first surface and said enclosure member and a second subcompartment defined at least in part by said second surface and said enclosure member; and wherein said circuit board further comprises a first aperture and a second aperture extending between the first surface and the second surface such that the first subcompartment is in fluid communication with the second subcompartment, the first and second apertures being vertically spaced apart.

2. The apparatus of claim 1 further comprising a liquid disposed within the compartment.

3. The apparatus of claim 1 wherein the circuit board includes a top end portion and a bottom end portion, and wherein the top end portion includes the first aperture and the bottom end portion includes the second aperture.

4. The apparatus of claim 1 further including a baffle disposed within the first subcompartment, said baffle configured to direct a liquid disposed with the first compartment toward a first aperture of the at least one aperture.

5. The apparatus of claim 4 wherein the baffle is secured to the circuit board within the first subcompartment.

6. The apparatus of claim 4 wherein the baffle is secured to the enclosure member within the first subcompartment.

7. The apparatus of claim 4 wherein the baffle extends outward from the first surface and downward.

8. The apparatus of claim 4 further including a second baffle disposed within the second subcompartment, said baffle configured to direct a fluid disposed with the second subcompartment toward a second aperture of the at least one aperture.

9. The apparatus of claim 8 wherein the baffle extends outward from the first surface and downward and the second baffle extends outward from the second surface and upward.

10. The apparatus of claim 1 wherein the enclosure includes a plurality of cooling fins configured to convey heat from a fluid disposed within the compartment to an external environment.

11. A method for cooling at least one circuit element disposed on a first surface of a circuit board, at least a portion of the circuit board disposed within an enclosure member that forms a fluid tight compartment, the compartment including a first subcompartment defined by the enclosure member and the first surface, and a second subcompartment defined by the enclosure member and a second surface of the circuit board, the method comprising:

dissipating a quantity of heat generated by the at least one circuit element to a first portion of liquid disposed in the first subcompartment;

advancing the first portion of liquid through an aperture that extends between the first surface and the second surface to allow the first portion of liquid to pass from the first subcompartment to the second subcompartment; and advancing a second portion of liquid through a second aperture that extends between the first surface and the second surface to allow the second portion of liquid to pass from the second subcompartment to the first subcompartment.

12. The method of claim 11 further comprising the steps of:

dissipating heat from the first portion of liquid via convection; and advancing at least some the first portion of the liquid through the second aperture that extends from the first surface to the second surface such that at least some of the first portion of liquid passes from the second subcompartment to the first subcompartment.

13. The method of claim 11 further comprising the step of:
advancing the first portion of liquid past a baffle, said baffled disposed in the first subcompartment and configured to assist in directing at least some of the first portion of liquid toward the aperture.

14. An arrangement for cooling an electronic assembly, the arrangement comprising:
a circuit board having a first surface, a second surface, and at least a first heat-generating element secured to the first surface;
an enclosure member secured to said circuit board so as to form a fluid tight compartment defined at least in part by said enclosure member and said circuit board, said compartment including a first subcompartment defined at least in part by said first surface and said enclosure member and a second subcompartment defined at least in part by said second surface and said enclosure member;
a liquid disposed within said compartment; and
wherein said circuit board further comprises a first aperture and a second aperture extending between the first surface and the second surface such that the first subcompartment is in fluid communication with the second subcompartment, the first and second apertures being vertically spaced apart.

15. The arrangement of claim 14 wherein the circuit board includes an external portion that extends outward of the compartment.

16. The apparatus of claim 14 wherein the circuit board includes a top end portion and a bottom end portion, and wherein the top end portion includes the first aperture and the bottom end portion includes the second aperture.

17. The apparatus of claim 14 further including a baffle disposed within the first subcompartment, said baffle configured to direct a liquid disposed with the first compartment toward a first aperture of the at least one aperture.

18. The apparatus of claim 17 wherein the baffle is secured to the circuit board within the first subcompartment.

19. The apparatus of claim 17 wherein the baffle is secured to the enclosure member within the first subcompartment.

20. The apparatus of claim 17 wherein the baffle extends outward from the first surface and downward.

21. The apparatus of claim 17 further including a second baffle disposed within the second subcompartment, said baffle configured to direct a fluid disposed with the second subcompartment toward a second aperture of the at least one aperture.

22. The apparatus of claim 21 wherein the baffle extends outward from the first surface and downward and the second baffle extends outward from the second surface and upward.

23. The apparatus of claim 15 wherein the enclosure includes a plurality of cooling fins configured to convey heat from a fluid disposed within the compartment to an external environment.

* * * * *